(12) United States Patent
Chien

(10) Patent No.: US 10,861,881 B2
(45) Date of Patent: Dec. 8, 2020

(54) ARRAY SUBSTRATE

(71) Applicant: SHENZHEN CHINA STAR OPTOELECTRONICS TECHNOLOGY CO., LTD., Guangdong (CN)

(72) Inventor: Ching Fu Chien, Guangdong (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 48 days.

(21) Appl. No.: 16/230,191

(22) Filed: Dec. 21, 2018

(65) Prior Publication Data

US 2020/0027902 A1 Jan. 23, 2020

Related U.S. Application Data

(63) Continuation of application No. PCT/CN2018/103811, filed on Sep. 3, 2018.

(30) Foreign Application Priority Data

Jul. 20, 2018 (CN) .......................... 2018 1 0810917

(51) Int. Cl.
*H04L 27/12* (2006.01)
*H01L 27/12* (2006.01)
(Continued)

(52) U.S. Cl.
CPC ....... *H01L 27/1244* (2013.01); *G09G 3/3266* (2013.01); *G09G 3/3275* (2013.01);
(Continued)

(58) Field of Classification Search
CPC .............. H01L 27/1244; H01L 51/442; H01L 27/3244; H01L 27/3276; H01L 27/1218; G09G 3/3266
See application file for complete search history.

(56) References Cited

U.S. PATENT DOCUMENTS

| 4,803,450 A * | 2/1989 | Burgess | .................. H01P 3/088 |
| | | | 228/180.22 |
| 2004/0051836 A1* | 3/2004 | Jung | ..................... G02F 1/1345 |
| | | | 349/149 |

(Continued)

FOREIGN PATENT DOCUMENTS

| CN | 102279678 A | 12/2011 |
| CN | 102998865 A | 3/2013 |

(Continued)

*Primary Examiner* — Charles D Garber
*Assistant Examiner* — S M Sohel Imtiaz
(74) *Attorney, Agent, or Firm* — Leong C. Lei

(57) ABSTRACT

The array substrate taught by the present invention have dummy ITO lines on the fanout lines configured as multiple segments separated at intervals so that, when two neighboring dummy ITO lines are short-circuited, the place of short circuit is limited to a segment of the neighboring dummy ITO lines. Coupling capacitance is limited to that between the segments and fanout lines. Compared to prior arts where coupling capacitance occurs between neighboring dummy ITO lines and fanout lines, the present invention has much smaller coupling capacitance, thereby reducing the impact of coupling capacitance to signal transmission on the fanout lines, avoiding the occurrence of light lines on the display panel, and enhancing the display effect of the display panel.

9 Claims, 4 Drawing Sheets

(51) Int. Cl.
*H01L 27/32* (2006.01)
*G09G 3/3266* (2016.01)
*H01L 51/44* (2006.01)
*G09G 3/3275* (2016.01)

(52) U.S. Cl.
CPC ...... *H01L 27/1218* (2013.01); *H01L 27/3244* (2013.01); *H01L 27/3276* (2013.01); *H01L 51/442* (2013.01)

(56) References Cited

U.S. PATENT DOCUMENTS

| | | | |
|---|---|---|---|
| 2010/0283955 A1* | 11/2010 | Kim | G02F 1/1345 349/149 |
| 2014/0332898 A1* | 11/2014 | Du | H01L 27/124 257/386 |
| 2017/0185181 A1* | 6/2017 | Kim | G02F 1/1345 |
| 2018/0061323 A1* | 3/2018 | Kwon | G09G 3/3258 |
| 2018/0121022 A1* | 5/2018 | Ahn | G06F 3/0412 |
| 2018/0211936 A1* | 7/2018 | Chang | H01L 23/544 |

FOREIGN PATENT DOCUMENTS

| | | |
|---|---|---|
| CN | 104460155 A | 3/2015 |
| CN | 104777687 A | 7/2015 |
| CN | 107861301 A | 3/2018 |
| KR | 20040087452 A | 10/2004 |
| KR | 20060091824 A | 8/2006 |

\* cited by examiner

US 10,861,881 B2

ARRAY SUBSTRATE

CROSS-REFERENCE TO RELATED APPLICATIONS

This application is a U.S. Continuation Application of PCT Patent Application No. PCT/CN2018/103811, filed on Sep. 3, 2018, which claims priority to Chinese Patent Application No. 201810810917.6, filed on Jul. 20, 2018, both of which are hereby incorporated herein by reference in their entireties.

FIELD OF THE INVENTION

The present invention is generally related to the field of display technology, and more particularly to an array substrate.

BACKGROUND OF THE INVENTION

For an existing array substrate, there are multiple fanout lines in the non-display area of the array substrate. Through the fanout lines, control chips in the non-display area are connected to signal lines in the display area, and signals from the control chips are as such delivered to the signal lines so that the display panel including the array substrate is able to display pictures. In addition, in some existing approaches, the indium tin oxide (ITO) layer on the fanout lines are is reserved to reduce the consumption of etching solution. As such, each fanout line has dummy ITO line stacked above, and the dummy ITO lines are continuous lines just like fanout lines. However, when forming the dummy ITO lines, neighboring dummy ITO lines may be short-circuited due to foreign objects and coupling capacitance may be developed between the two connected dummy ITO lines and their corresponding fanout line. As such, the display panel including the array substrate may show light lines, affecting the display effect of the display panel.

SUMMARY OF THE INVENTION

The present invention teaches an array substrate that reduces coupling capacitance between neighboring dummy ITO lines and fanout lines, thereby avoiding the occurrence of light lines on the display panel and enhancing the display effect of the display panel.

The array substrate comprises a display area, a non-display area surrounding the display area, a plurality of signal lines within the display area, control chips within the non-display area, a plurality of fanout lines separated at intervals within the non-display area, a plurality dummy indium tin oxide (ITO) lines separated at intervals within the non-display area, and a first insulation layer, wherein each fanout line has an end connected to a control chip and another end connected to a signal line, the dummy ITO lines are stacked above the fanout lines, the dummy ITO lines and the fanout lines are separated by the first insulation layer, each fanout line corresponds to a dummy ITO line, and each dummy ITO line comprises a plurality of ITO segments separated at intervals along an extension direction of a corresponding fanout line.

Each dummy ITO line and its corresponding fanout line have partially overlapped vertical projections.

The signal lines comprise scan lines and data lines stacked above the scan lines; a plurality of the fanout lines are electrically connected to the scan lines for transmitting scan signals from the scan lines; and another plurality of fanout lines are electrically connected to the data lines for transmitting data signals from the data lines.

The fanout lines connecting the scan lines are at a same layer as the scan lines and formed in a same process; and the fanout lines connecting the data lines are at a same layer as the data lines and formed in a same process.

The fanout lines connecting the scan lines and the fanout lines connecting the data lines compromise first fanout lines and second fanout lines; the first fanout lines and the scan lines are at a same layer and formed in a same process; the second fanout lines and the data lines at a same layer and formed in a same process; and the second fanout lines' projections to a layer where the first fanout lines are disposed are between neighboring first fanout lines.

The array substrate further comprises a second insulation layer, wherein each fanout line comprises a first conductive line and a second conductive line stacked above the first conductive line; and the first and second conductive lines are separated by the second insulation layer.

The second insulation layer has a plurality of vias arranged at intervals; and the first conductive lines and second conductive lines are electrically connected together through the vias.

The first and second conductive lines have an identical resistance.

The first and second conductive lines are made a same conductive material; and the first and second conductive lines are of a same line width.

The first conductive lines' projections onto the second conductive lines are overlapped with the second conductive lines.

The array substrate taught by the present invention have dummy ITO lines on the fanout lines configured as multiple segments separated at intervals so that, when two neighboring dummy ITO lines are short-circuited, the place of short circuit is limited to a segment of the neighboring dummy ITO lines. Coupling capacitance is limited to that between the segments and fanout lines. Compared to prior arts where coupling capacitance occurs between neighboring dummy ITO lines and fanout lines, the present invention has much smaller coupling capacitance, thereby reducing the impact of coupling capacitance to signal transmission on the fanout lines, avoiding the occurrence of light lines on the display panel, and enhancing the display effect of the display panel.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

The present invention teaches an array substrate for a display panel. It should be understandable that the display panel may be a liquid crystal display (LCD) panel, or an organic light emitting diode (OLED) display panel. The array substrate is a part of the OLED panel or, if the display panel is a LCD panel, the display panel also includes a color filter (CF) substrate disposed oppositely to the array substrate, and a liquid crystal layer between the CF and array substrates. In the following description, the display panel is a LCD panel.

Figure 1:
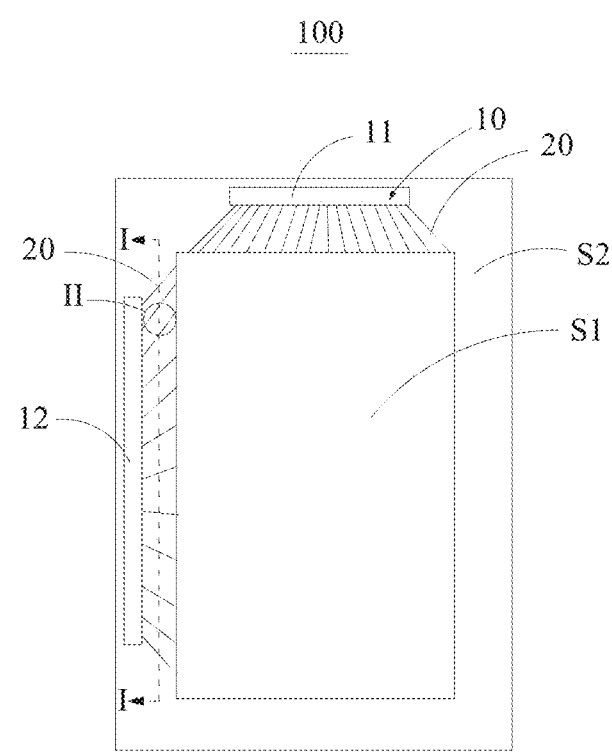
FIG. 1 is a structural schematic diagram showing an array substrate according to an embodiment of the present invention.

As shown in FIG. 1, the present invention teaches an array substrate 100, including a display area S1 and a non-display area S2 surrounding the display area S1. There are multiple signal lines within the display area S1 (not shown). There are control chips 10 and multiple fanout lines 20 separated at intervals within the non-display area S2. Each fanout line 20 has an end connected to a control chip 10, and another end connected to a signal line. As such, the control chips 10 are electrically connected to and transmit driving and data signals to the signal lines through the fanout lines 20.

Figure 2:
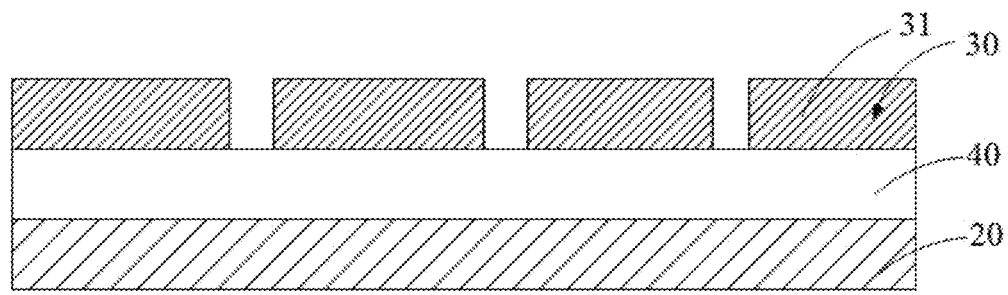
FIG. 2 is a sectional schematic diagram showing the array substrate of FIG. 1 along an extension direction of a fanout line.
Figure 3:
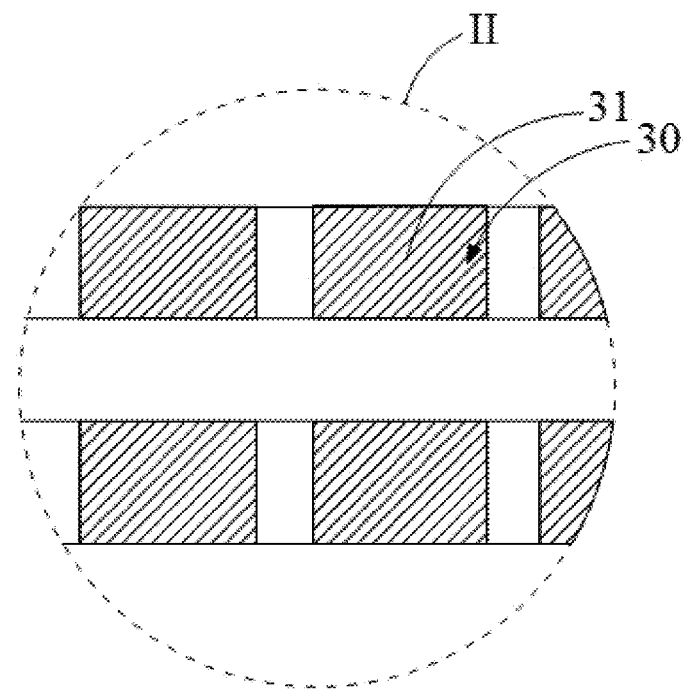
FIG. 3 is an enlarged schematic diagram at the II location of FIG. 1.

As shown in FIGS. 2 and 3, there are dummy indium tin oxide (ITO) lines 30 above the fanout lines 20 and separated from the fanout lines 20 by a first insulation layer 40. Specifically, a pixel electrode material layer is formed as a topmost layer of the array substrate 100 that covers both the display area S1 and the non-display area S2. The pixel electrode material layer is then patterned to form pixel electrodes through lithography. To entirely remove the pixel electrode material layer within the non-display area S2, a large amount of etching solution would be required, and this large amount of etching solution may affect the display effect of the display area S1. Therefore, in the present invention, the pixel electrode material layer within the non-display area S2 is partially etched during patterning, and the pixel electrode material layer above the fanout lines 20 is preserved to form the dummy ITO lines 30. In this way, the consumption of etching solution is reduced and the normal function of the array substrate is guaranteed.

The dummy ITO lines 30 includes multiple ITO segments 31 arranged at intervals along the fanout lines 20. When two dummy ITO lines 30 are short-circuited, only the ITO segments 31 at the short-circuit location are short-circuited, instead that the entire dummy ITO lines 30 are short-circuited. As such, the coupling capacitance between neighboring dummy ITO lines 30 and the fanout lines 20 is significantly reduced compared to the prior art, thereby reducing the impact of the coupling capacitance to the signal transmission on the fanout lines 20, avoiding the occurrence of light lines, and enhancing the display quality of the display panel. Trough actual testing, prior art has a 0.4% possibility in having light lines due to dummy ITO lines 30's short circuit. The present invention may effectively resolve the light line problem resulted from short-circuited dummy ITO lines 30.

Figure 4:
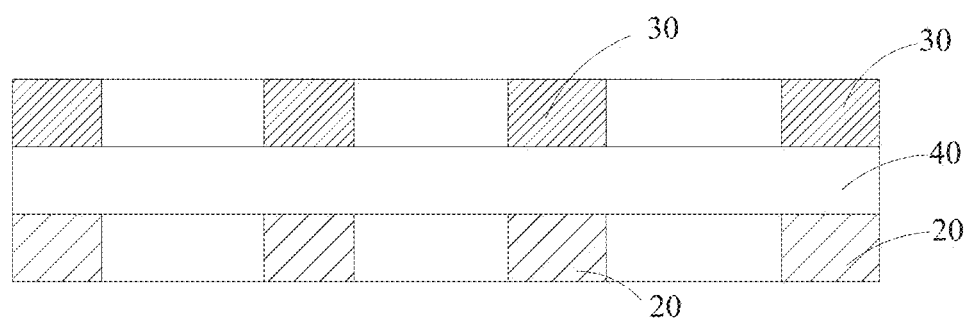
FIG. 4 is a sectional schematic diagram along the I-I line of the array substrate of FIG. 2.

As shown in FIG. 4, in some embodiments, the dummy ITO lines 30 and the fanout lines 20 have partially overlapped vertical projections, thereby reducing the coupling capacitance between the dummy ITO lines 30 and the fanout lines 20, achieving better signal transmission over the fanout lines 20, and enhancing the display quality of the display panel using the array substrate 100. It should be understandable that the dummy ITO lines 30 and the fanout lines 20 may have completely overlapped vertical projections.

Figure 5:
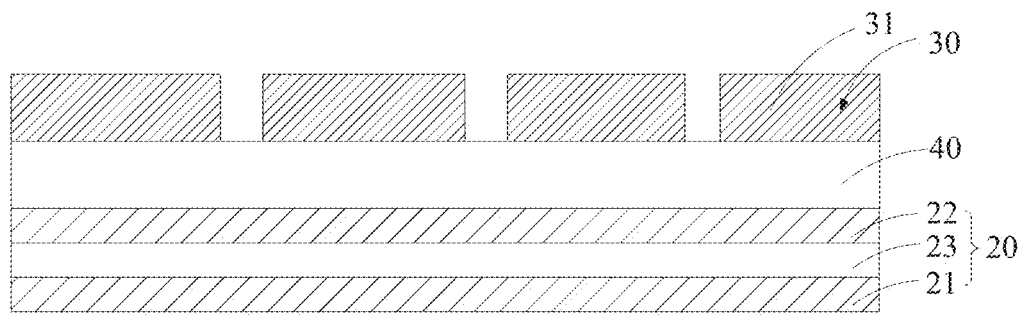
FIG. 5 is a sectional schematic diagram showing an array substrate according to another embodiment of the present invention along an extension direction of a fanout line.

Furthermore, the fanout lines 20 of the present invention may have a single-layer or dual-layer structure. As shown in FIG. 2, single-layer fanout lines 20 means that each fanout line 20 is a single line. As shown in FIG. 5, dual-layer fanout lines 20 means that each fanout line 20 includes a first conductive line 21, a second conductive line 22 stacked above the first conductive line 21, and an insulation layer 23 in between separating the first and second conductive lines 21 and 22. For dual-layer fanout lines 20, each first conductive line 21 and its corresponding second conductive line 22 both have one end electrically connected to a terminal of a control chip 10 and another end to a signal line. It is like the first and second conductive lines 21 and 22 are parallel-connected between the control chip 10 and the signal line. Therefore, dual-layer fanout lines 20 have much reduced resistances, thereby enhancing the signal transmission effect of the fanout lines 20.

As shown in FIGS. 1 and 2, this embodiment has single-layer fanout lines 20. In the present invention, the signal lines include scan lines and data lines separated by gate insulation layer and semiconductor layer. The control chips 10 includes scan driving chip 11 and data driving chip 12. The scan lines are electrically connected to the scan driving chip 11, and the scan driving chip 11 provides scan signals to the scan lines. The data lines are electrically connected to the data driving chip 12, and the data driving chip 12 provides data signals to the data lines. The scan driving chip 11 is electrically connected to the scan lines through the fanout lines 20. The data driving chip 12 is electrically connected to the data lines through the fanout lines 20. In the present embodiment, the fanout lines 20 connecting the scan driving chip 11 and the scan lines are at a same layer as the scan lines and formed in a same process. In other words, a lithographic means forms the scan lines and those fanout lines 20 simultaneously. The fanout lines 20 connecting the data driving chip 12 and the data lines are at a same layer as the data lines and formed in a same process. In other words, a lithographic means forms the data lines and those fanout lines 20 simultaneously.

Figure 6:
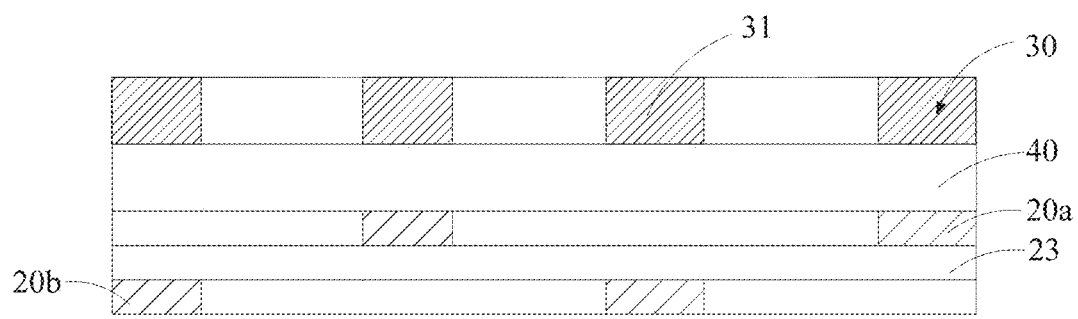
FIG. 6 is a sectional schematic diagram along the I-I line of the array substrate of FIG. 5.

Furthermore, as shown in FIGS. 1 and 6, the fanout lines 20 connecting the scan driving chip 11 and the fanout lines 20 connecting the data driving chip 12 both include multiple first fanout lines 20a and second fanout lines 20b. The following description uses the fanout lines 20 connecting the scan driving chip 11 as example and the first fanout lines 20a and second fanout lines 20b both connect the scan driving chip 11 to the signal lines so that scan signals from the scan driving chip 11 are delivered to the signal lines. The first fanout lines 20a and second fanout lines 20b are at separate layers. In the present embodiment, the first fanout lines 20a and the scan lines are at a same layer and formed in a same process. The second fanout lines 20b and the data lines at a same layer and formed in a same process. The electrical connection from the second fanout lines 20b to the scan lines and the scan driving chip 11 is achieved through vias. In contrast to the single-layer fanout lines, the present embodiment has the first fanout lines 20a and second fanout lines 20b disposed at separate layers, thereby increasing a total number of fanout lines while keeping a same or fewer number of fanout lines in each layer. This would facilitate the fulfillment of high pixel count and high resolution in the display panel including the array substrate of the present invention. In addition, where there are fewer fanout lines 20 in a layer, it is easier to conduct layout design for a non-display area of a specific size.

Furthermore, in the present embodiment, the second fanout lines 20*b*'s projections to the layer where the first fanout lines 20*a* are disposed are between neighboring first fanout lines 20*a*. In other words, the second fanout lines 20*b* and first fanout lines 20*a* have alternate and separated vertical projections. In other words, the first fanout lines 20*a* and second fanout lines 20*b* have non-overlapping vertical projections, preventing coupling capacitance to occur between the first fanout lines 20*a* and second fanout lines 20*b*, and guaranteeing signal transmission through the first fanout lines 20*a* and second fanout lines 20*b*. It should be understandable that, in alternative embodiments, the first fanout lines 20*a* and second fanout lines 20*b* may have completely or partially overlapping vertical projections.

Figure 7:
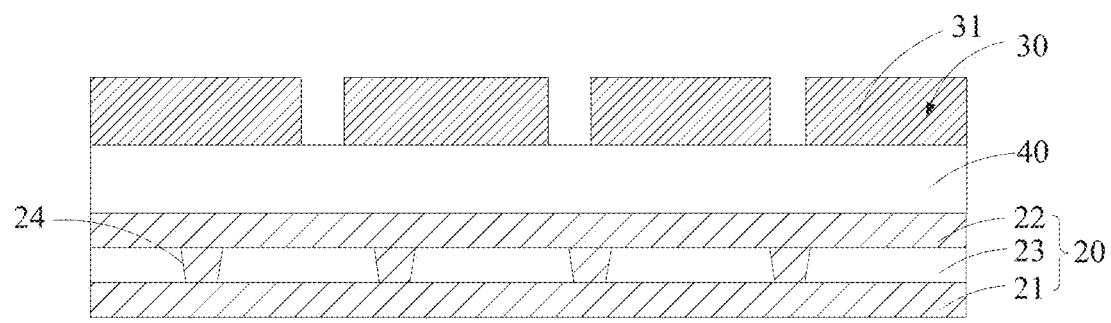
FIG. 7 is a sectional schematic diagram showing an array substrate according to another embodiment of the present invention along an extension direction of a fanout line.

As shown in FIG. 7, in another embodiment of the present invention where the fanout lines 20 have the dual-layer structure, the insulation layer 23 separating the first conductive lines 21 and second conductive lines 22 has multiple vias 24 arranged at intervals. The first conductive lines 21 and second conductive lines 22 are electrically connected together through the vias 24. In the present embodiment, the first conductive lines 21 and signal lines are at a same layer and formed in a same process. The second conductive lines 22 and data lines are at a same layer and formed in a same process. In addition, the insulation layer 23 separating the first conductive lines 21 and second conductive lines 22, the gate insulation layer, and/or the semiconductor layer are at a same layer and formed in a same process. The insulation layer 23 is patterned so as to obtain the vias 24 connecting the first conductive line 21 and second conductive lines 22. The vias 24 partitions the first conductive lines 21 into multiple first segments. In other words, a segment of a first conductive line 21 between two neighboring vias 24 is a first segment. The vias 24 partitions the second conductive lines 22 into multiple second segments. In other words, a segment of a second conductive line 22 between two neighboring vias 24 is a second segment. Each first segment corresponds a second segment. Specifically, in the present embodiment, each second segment is right above its corresponding first segment, and is electrically connected to the corresponding first segment through a via 24. In other words, corresponding first and second segments are parallel connected and they are then connected to other parallel-connected first and second segments. Therefore, when a first conductive line 21 and a second conductive line 22 are broken off at certain segments, only resistance at the segments is varied, thereby reducing the overall resistance variation for the entire fanout line 20, and guaranteeing that the fanout line 20 to have better signal transmission effect. In addition, when a first conductive line 21 and a second conductive line 22 both have a segment broken off but these segments are not corresponding segments, the fanout line 20 may continue to provide normal signal transmission, guaranteeing the quality of the array substrate 100.

Furthermore, in the present embodiment, the first conductive line 21 and the second conductive line 22 have an identical resistance, and each first segment and its corresponding second segment have an identical resistance. The fanout line 20 of the parallel connected first conductive line 21 and second conductive line 22 thereby has the smallest resistance, thereby enhancing signal transmission and display quality of the display panel. Specifically, in the present embodiment, the first conductive line 21 and second conductive line 22 is made of an identical conductive material. The first conductive line 21 and second conductive line 22 are also of a same line width, so that they have an identical resistance. In addition, in the present embodiment, each second segment is right above a first segment, each first segment has a same length as its corresponding second segment, and therefore each first segment has a same resistance as its corresponding second segment. It should be understandable, in alternative embodiments, the first conductive line 21 and second conductive line 22 may be made of different materials, they may still have an identical resistance by adjusting line widths of the first conductive line 21 and second conductive line 22. In the meantime, each first segment has an identical resistance as its corresponding second segment.

Furthermore, the first conductive line 21's projection on the second conductive line 22 is overlapped with the second conductive line 22. As such, each fanout lines 20 takes up a least amount of area in the non-display area S2, and the distance between two neighboring fanout lines 20 may be as wide as possible, thereby reducing the layout difficulty, preventing cross-talk between neighboring fanout lines 20, and guaranteeing signal transmission effect on the fanout lines 20.

The array substrate 100 taught by the present invention have dummy ITO lines 30 configured as multiple segments separated at intervals so that, when two neighboring dummy ITO lines 30 are short-circuited, the place of short circuit is limited to a segment of the neighboring dummy ITO lines 30. Coupling capacitance is also limited to that between the segments and fanout lines 20. Compared to prior arts where coupling capacitance occurs between neighboring dummy ITO lines 30 and fanout lines 20, the present invention has much smaller coupling capacitance, thereby reducing the impact of coupling capacitance to signal transmission on the fanout lines 20, avoiding the occurrence of light lines on the display panel, and enhancing the display effect of the display panel.

Above are embodiments of the present invention, which does not limit the scope of the present invention. Any equivalent amendments within the spirit and principles of the embodiment described above should be covered by the protected scope of the invention.

What is claimed is:

1. An array substrate, comprising a display area,
a non-display area surrounding the display area,
a plurality of signal lines within the display area,
control chips within the non-display area,
a plurality of fanout lines separated at intervals within the non-display area,
a plurality dummy indium tin oxide (ITO) lines separated at intervals within the non-display area, and
a first insulation layer,
wherein the signal lines comprise scan lines and data lines stacked above the scan lines;
the plurality of the fanout lines are electrically connected between one control chip and the scan lines for transmitting scan signals to the scan lines;
another plurality of fanout lines are electrically connected between another control chip and the data lines for transmitting data signals to the data lines;
the dummy ITO lines are stacked above the fanout lines;
the dummy ITO lines and the fanout lines are separated by the first insulation layer;

each dummy ITO line comprises a plurality of ITO segments separated at intervals along an extension direction of the corresponding fanout line, the fanout lines connecting the scan lines and the fanout lines connecting the data lines comprise first fanout lines and second fanout lines;

the first fanout lines and the scan lines are formed in a same process in a first layer;

the second fanout lines and the data lines are formed in a same process in a second layer;

each of the first and second fanout lines corresponds to a dummy ITO line;

the first fanout lines and the second fanout lines have alternate and non-overlapping vertical projections; and each dummy ITO line and its corresponding fanout line have partially overlapped vertical projections.

2. The array substrate according to claim 1, further comprising a second insulation layer, wherein each fanout line comprises a first conductive line and a second conductive line stacked above the first conductive line; and the first and second conductive lines are separated by the second insulation layer.

3. The array substrate according to claim 2, wherein the second insulation layer has a plurality of vias arranged at intervals; and the first conductive lines and second conductive lines are electrically connected together through the vias.

4. The array substrate according to claim 2, wherein the first and second conductive lines have an identical resistance.

5. The array substrate according to claim 3, wherein the first and second conductive lines have an identical resistance.

6. The array substrate according to claim 4, wherein the first and second conductive lines are made of a same conductive material;

and the first and second conductive lines are of a same line width.

7. The array substrate according to claim 5, wherein the first and second conductive lines are made of a same conductive material;

and the first and second conductive lines are of a same line width.

8. The array substrate according to claim 2, wherein the first conductive lines' projections onto the second conductive lines are overlapped with the second conductive lines.

9. The array substrate according to claim 1, wherein the control chips comprise a scan driving chip and a data driving chip.

* * * * *